United States Patent
Huang et al.

(10) Patent No.: US 9,998,103 B2
(45) Date of Patent: Jun. 12, 2018

(54) DELAY LINE CIRCUIT

(71) Applicant: TAIWAN SEMICONDUCTOR MANUFACTURING COMPANY, LTD., Hsinchu (TW)

(72) Inventors: Ming-Chieh Huang, San Jose, CA (US); Chan-Hong Chern, Palo Alto, CA (US); Tsung-Ching (Jim) Huang, Mountain View, CA (US); Chih-Chang Lin, San Jose, CA (US); Tien-Chun Yang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 15/413,742

(22) Filed: Jan. 24, 2017

(65) Prior Publication Data
US 2017/0134013 A1    May 11, 2017

Related U.S. Application Data

(62) Division of application No. 14/555,198, filed on Nov. 26, 2014, now Pat. No. 9,584,107.

(51) Int. Cl.
*H03K 5/134* (2014.01)
*H03L 7/08* (2006.01)
(Continued)

(52) U.S. Cl.
CPC ... *H03K 5/134* (2014.07); *H03K 2005/00052* (2013.01); *H03K 2005/00195* (2013.01)

(58) Field of Classification Search
CPC ......... H03K 5/134; H03K 2005/00052; H03K 2005/00195
(Continued)

(56) References Cited

U.S. PATENT DOCUMENTS 5,686,850 A    11/1997  Takaki et al.
5,945,862 A     8/1999  Donnelly
(Continued)

FOREIGN PATENT DOCUMENTS

JP    2003133948    5/2003
JP    2011-259286   12/2011
KR    10-2013-0043456    4/2013

OTHER PUBLICATIONS

Antti Mäntyniemi et al., "A CMOS Time-to-Digital Converter (TDC) Based on a Cyclic Time Domain Successive Approximation Interpolation Method", IEEE Journal of Solid-State Circuits, vol. 44, No. 11, Nov. 2009, pp. 3067-3078.
(Continued)

*Primary Examiner* — Brandon S Cole
(74) *Attorney, Agent, or Firm* — Hauptman Ham, LLP

(57) ABSTRACT

A delay line circuit includes: a coarse-tuning arrangement, including delay units; and a fine-tuning arrangement including at least three serially-connected inverters. The coarse-tuning arrangement is configured to receive an input signal and coarsely-tune the input signal, the coarsely-tuning including transferring the input signal through a selected number of the delay units and thereby producing a first output signal. The fine-tuning arrangement is configured to receive the first output signal, finely-tune the first output signal, and produce a second output signal, the finely-tuning including selectively connecting a speed control unit to a node between a corresponding pair of the at least three serially-connected inverters.

20 Claims, 7 Drawing Sheets

(51) Int. Cl.
*H03L 7/06* (2006.01)
*H03H 11/16* (2006.01)
*H03K 5/00* (2006.01)

(58) Field of Classification Search
USPC ...... 327/261–264, 269, 270, 276–278, 2–12, 327/105–123, 141, 144–163; 331/15–17; 375/373–376
See application file for complete search history.

(56) References Cited

U.S. PATENT DOCUMENTS

| | | | |
|---|---|---|---|
| 6,175,605 B1 | 1/2001 | Chi | |
| 6,348,826 B1 | 2/2002 | Mooney et al. | |
| 7,209,852 B2* | 4/2007 | Bleakley | G01R 31/31709 327/114 |
| 7,323,916 B1 | 1/2008 | Sidiropoulos | |
| 8,519,761 B1 | 8/2013 | Kossel | |
| 8,593,208 B2 | 11/2013 | Kim | |
| 8,754,793 B2 | 6/2014 | Henzler | |
| 8,941,431 B2* | 1/2015 | Granhaug | H03M 7/165 327/269 |
| 2003/0095009 A1* | 5/2003 | Gomm | H03K 5/135 331/57 |
| 2004/0066873 A1 | 4/2004 | Cho | |
| 2004/0222832 A1 | 11/2004 | Chansungsan | |
| 2005/0258882 A1 | 11/2005 | Chansungsan | |
| 2006/0145740 A1 | 7/2006 | Park | |
| 2006/0145741 A1* | 7/2006 | Panpalia | H03L 7/0814 327/158 |
| 2007/0234080 A1 | 10/2007 | Mackey | |
| 2008/0012647 A1* | 1/2008 | Risbo | H03L 7/093 331/16 |
| 2008/0136475 A1* | 6/2008 | Gomm | H03L 7/0814 327/158 |
| 2008/0201675 A1* | 8/2008 | Wissel | G01R 31/31725 716/113 |
| 2010/0079180 A1 | 4/2010 | Kim | |
| 2010/0141328 A1 | 6/2010 | Meninger | |
| 2011/0068827 A1 | 3/2011 | Ali | |
| 2012/0313683 A1 | 12/2012 | Rylov | |
| 2014/0119099 A1* | 5/2014 | Clark | G11C 5/146 365/149 |

OTHER PUBLICATIONS

Piotr Dudek et al., "A High-Resolution CMOS Time-to-Digital Converter Utilizing a Vernier Delay Line", IEEE Transactions on Solid-State Circuits, vol. 35, No. 2, Feb. 2000, pp. 240-247.

Antonio H. Chan et al., "A Jitter Characterization System Using a Component-Invariant Vernier Delay Line", IEEE Transactions on Very Large Scale Integration (VLSI) Systems, vol. 12, No. 1, Jan. 2004, pp. 79-95.

Ting-Yuan Wang et al., "Multiple Channel Programmable Timing Generators With Single Cyclic Delay Line", IEEE Transactions on Instrumentation and Measurement, vol. 53, No. 4, Aug. 2004, pp. 1295-1303.

Notice of Allowance dated May 31, 2016 from corresponding No. TW 104119821.

Notice of Allowance dated Nov. 17, 2016 and English translation from corresponding application No. KR 10-2015-0078197.

Office Action dated Apr. 29, 2016 and English translation from corresponding No. KR 10-2015-0078197.

* cited by examiner

DELAY LINE CIRCUIT

PRIORITY CLAIM

The present application is a divisional of U.S. application Ser. No. 14/555,198, filed Nov. 26, 2014, now U.S. Pat. No. 9,584,107, issued Feb. 28, 2017, which is incorporated herein by reference in its entirety.

BACKGROUND

Delay elements are building blocks of clock distribution networks in some integrated circuits and systems. Delay elements are intended to define a time reference for movement of data within those systems. Variable delay elements are inverter-based circuits used for fine, precise, and accurate pulse delay (or phase) control in high-speed digital integrated circuits. In order to achieve wide delay or phase adjustments, variable delay elements are realized as a chain of inverters. The chain of inverters is called delay line.

In many integrated circuits, delay lines are used in systems such as in DLLs (Delay Locked Loops), TDCs (Time-to-Digital Converters), VCOs (Voltage Controlled Oscillators), Pulse-Width Control Loops (PWCLs), etc. In such applications, variable delay elements are used for precise and accurate pulse time reference.

Double Data Rate circuits, which transfer data on both the rising and falling edges of the clock signal, also use delay lines and delay data or clock delays to achieve appropriate signal timing in a data transmission. Delay lines provide linear steps that are used to tune an input signal delay. However, inconsistent delay step variations increase clock jitters, in some instances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
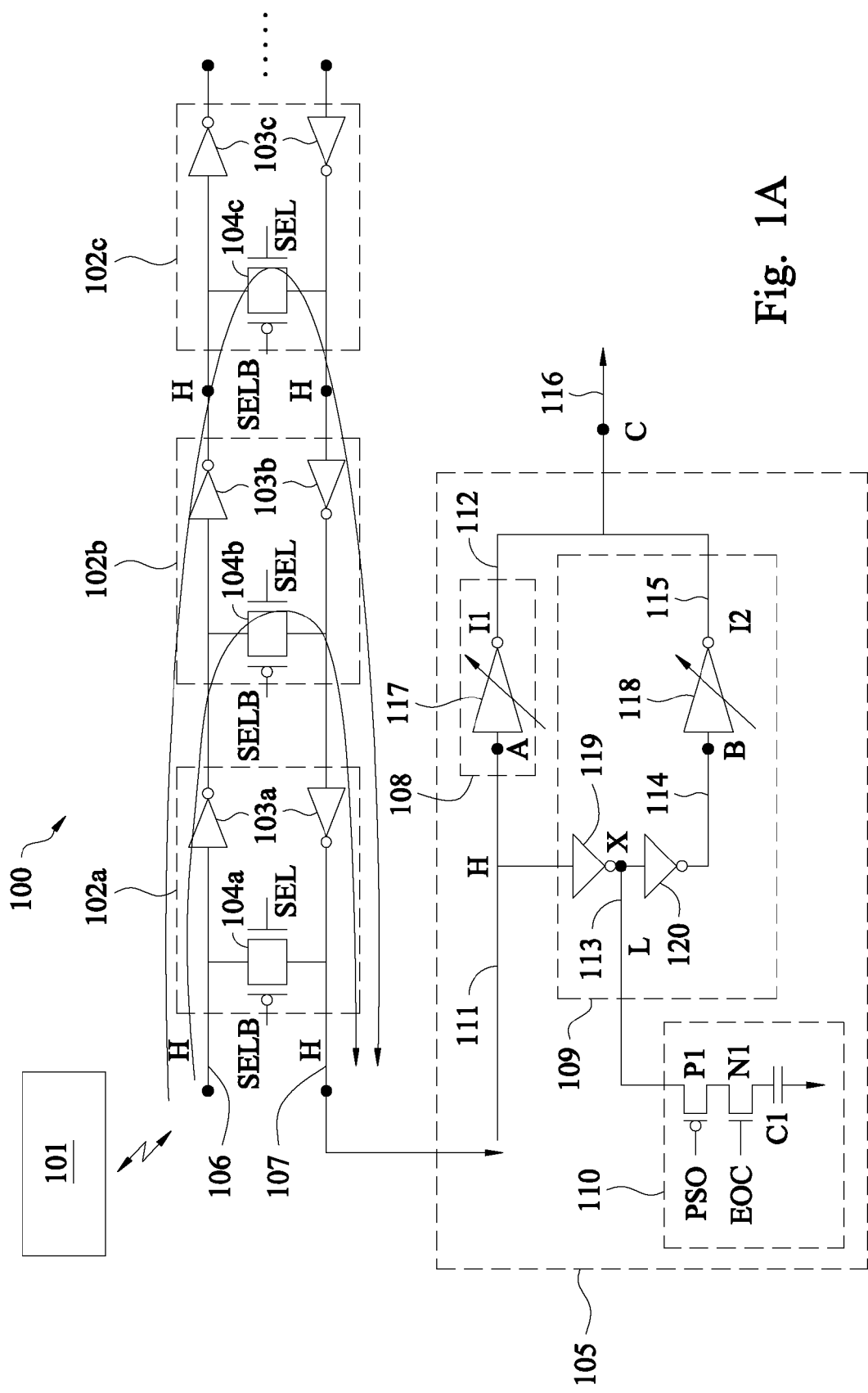
FIG. 1A is an exemplary delay line circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

High-speed synchronous integrated circuits, such as microprocessors and memories, have tightly aligned clock signals in operation. For example, a double data rate (DDR) synchronous dynamic random access memory (SDRAM) is an application where clock synchronization is tightly controlled. DDR-SDRAM components are placed in parallel on a system to provide a wide bandwidth for data transfer, in some embodiments. To help ensure that the data bits are aligned, each component uses a clock synchronization circuit to align an output of the component with a system clock.

As DDR applications are becoming more popular in system on chip designs, some DDR systems, e.g., DDR4 systems, are capable of achieving data speeds of approximately 3.2 GHz. DDR systems use delay lines and delay data or clock delays to achieve appropriate signal timing in a data transmission. Delay lines provide linear steps that are used to tune a received input signal delay. Inconsistent delay step variations increase clock jitter. Jitter is an amount of phase error on an output when an input phase is constant, which introduces noise to the output signal.

Signal delays in high speed DDR systems are often tuned by coarse tuning and fine tuning. Some high speed DDR systems introduce steps that often have delays in the 6-8 picosecond range. However, step delays in the 6-8 picosecond range introduce jitter, not only because of the size of the delay, but also because there is a significant variation between these delays of each step.

FIG. 1A is an exemplary delay line circuit 100 in accordance with some embodiments. The delay line circuit 100 is configured to provide a tunable delay that is digitally controlled by a delay line controller 101. The delay line circuit 100 is configured to provide a large enough delay for low speed applications and a small enough delay for high speed applications. For example, the delay line circuit 100 is capable of providing a tunable delay for low speed or low frequency signals having a signal frequency of about 800 MHz, or lower, to high speed or high frequency signals having a signal frequency of about 3200 MHz or greater, and anywhere in between, in some embodiments.

The delay line circuit 100 comprises the delay line controller 101, delay units 102a, 102b, 102c, ..., 102n (collectively referred to as "delay unit 102", and 102n is not shown in FIG. 1A), and a phase interpolator 105. The delay line circuit 100 includes n delay units 102, where n is a positive integer. The delay units 102 receive an input signal 106 and modify the input signal 106 to produce a first output signal 107 by delaying the input signal 106. The delay units 102 selectively invert the input signal 106 en route to producing the first output signal 107, in some embodiments. The delay line controller 101 selectively causes the input signal 106 to be received, processed, and output by a specified number of the delay units 102 to produce the first output signal 107, in some embodiments.

Each delay unit 102 includes two inverters 103 (one upper inverter and one lower inverter in FIG. 1A, both labeled the same, e.g., 103a, 103b, 103c, etc.) for inverting the input signal 106 and a pass gate 104 (e.g., 104a, 104b, 104c, etc.)

for relaying the input signal 106, in some embodiments. For example, the input signal 106 is assumed to have a data high (i.e., H) phase with a rising edge at a given time. Assuming the delay line controller 101 has an instruction of how much delay the input signal 106 should have, the delay line controller 101 controls how many delay units 102 the input signal 106 passes through. For example, the control signals SEL and SELB of each pass gate 104 are controlled by the delay line controller 101, based on the instruction. The input signal 106 is received, processed, and output by a specified number of the delay units 102 to produce the first output signal 107, based on the instruction received from the delay line controller 101. The instruction is based on an estimated delay difference of multiple signal paths or the additional delay desired in some embodiments.

For example, if the delay line controller 101 has the instruction to cause the input signal 106 to be transmitted through delay units 102a and 102b, the control signals SEL and SELB of the second delay unit 102b are set to enable the pass gate 104b, while the control signals SEL and SELB of the other delay units 102 are set to disable the other pass gates 104. The input signal 106 is inverted from the H phase to a data low (i.e., L) phase with a falling edge by the upper inverter 103a of the delay unit 102a and relayed in the same phase, i.e. L phase, by the pass gate 104b of the delay unit 102b back to delay unit 102a. The lower inverter 103a of the delay unit 102a then inverts the input signal 106 again from the L phase to the H phase and the first output signal 107 is provided. The first output signal 107 is delayed by passing through two delay units 102a and 102b in this example.

Alternatively, if the delay line controller 101 has the instruction to cause the input signal 106 to be transmitted through delay units 102a, 102b and 102c, the control signals SEL and SELB of the third delay unit 102c are set to enable the pass gate 104c, while the control signals SEL and SELB of the other delay units 102 are set to disable the other pass gates 104. The input signal 106 is inverted from H phase to L phase by the upper inverter 103a of the delay unit 102a, inverted from L phase to H phase by the upper inverter 103b of the delay unit 102b, and relayed in the same phase, i.e., H phase, by the pass gate 104c of the delay unit 102c back to delay unit 102b. The lower inverter 103b of the delay unit 102b then inverts input signal 106 from the H phase to the L phase and the lower inverter 103a of the delay unit 102a inverts the input signal 106 from the L phase to the H phase. And the first output signal 107 is accordingly produced. The first output signal 107 passing through delay units 102a-102c is delayed further if compared to the previous example of passing through delay units 102a-102b because the input signal 106 passes through three delay units 102a, 102b, and 102c, instead of two delay units 102a and 102b.

The phase interpolator 105 is configured to receive the first output signal 107 as an input signal 111 at an input end of the phase interpolator 105. The phase interpolator 105 is also configured to output a second output signal 116 from an output end of the phase interpolator 105.

The phase interpolator unit 105 includes a first phase unit 108 and a second phase unit 109, in some embodiments. The first phase unit 108 provides a first phase output 112 having a first phase, in some embodiments. The first phase unit 108 includes a first variable inverter 117, in some embodiments. The first variable inverter 117 provides the first phase output 112 having a first variable current output I1, in some embodiments.

The second phase unit 109 provides a second phase output 115 having a second phase, in some embodiments. The second phase unit 109 includes two inverters 119 and 120, and a second variable inverter 118, in some embodiments. The second variable inverter 118 provides the second phase output 115 having a second variable current output I2, in some embodiments. The inverters 119 and 120 add delay to the input signal 111 of the phase interpolator 105 and provide an input signal 114 of the second variable inverter 118. The phase difference between the first phase output 112 and the second phase output 115 can be fine-tuned by controlling the first and second variable inverters 117 and 118 as described below with respect to FIG. 1B in some embodiments. The delay from the two inverters 119 and 120 is about the same as the delay from the two inverters 103 in one delay unit 102, in some embodiments. In this case, the total delay change from fine tuning of the phase interpolator unit 105 is the same as one step delay change of coarse tuning by adding one delay unit 102. In some embodiments, the total delay change from fine tuning of the phase interpolator unit 105 is different from one step delay change of coarse tuning by adding one delay unit 102.

In some embodiments, the first variable inverter 117 and the second variable inverter 118 include multiple inverters, such as eight inverters, connected in parallel. In some embodiments, at least one of the first variable inverter 117 or the second variable inverter 118 includes more or less than eight inverters. As the number of enabled (turned on) inverters in each variable inverter 117 or 118 is independently changed from zero to a maximum number (eight if eight inverters are connected in parallel), the current output of the variable inverter 117 or 118 changes from zero current to a maximum current. In some embodiments, the first variable current output I1 and the second variable current output I2 are controlled together based on an instruction from the delay line controller 101, so that the second output 116 will have a non-zero current output and a third phase ranging from the first phase of the first phase output 112 and to the second phase of the second phase output 115. The third phase is controlled based on a current output ratio (I1:I2) of the first phase output 112 and the second phase output 115 as described below with respect to FIG. 1B in some embodiments.

In a fine tuning mode, the phase interpolator unit 105 (controlled by the delay line controller 101) provides the second output signal 116 having a number of fine tuning steps, and each fine tuning step specifies an additional time delay (or phase) from a previous fine tuning step by a specified time delay (or phase). For example, a coarse tune of the input signal 106 en route to producing the second output signal 116 yields one step, in some embodiments. The one step of the coarse tune is broken into a specified number of steps, such as eight steps, in the fine tuning mode in some embodiments. The specified time delay between any of the steps in the fine tuning mode is in a range of about 2 picoseconds (ps) to about 3 ps, in some embodiments. Similarly, the same time delay occurs between a last step of the fine tuning steps and a next first step of next fine tuning steps in the second output signal 116. An offset unit 110 in the phase interpolator unit 105 is described below.

Figure 1B:
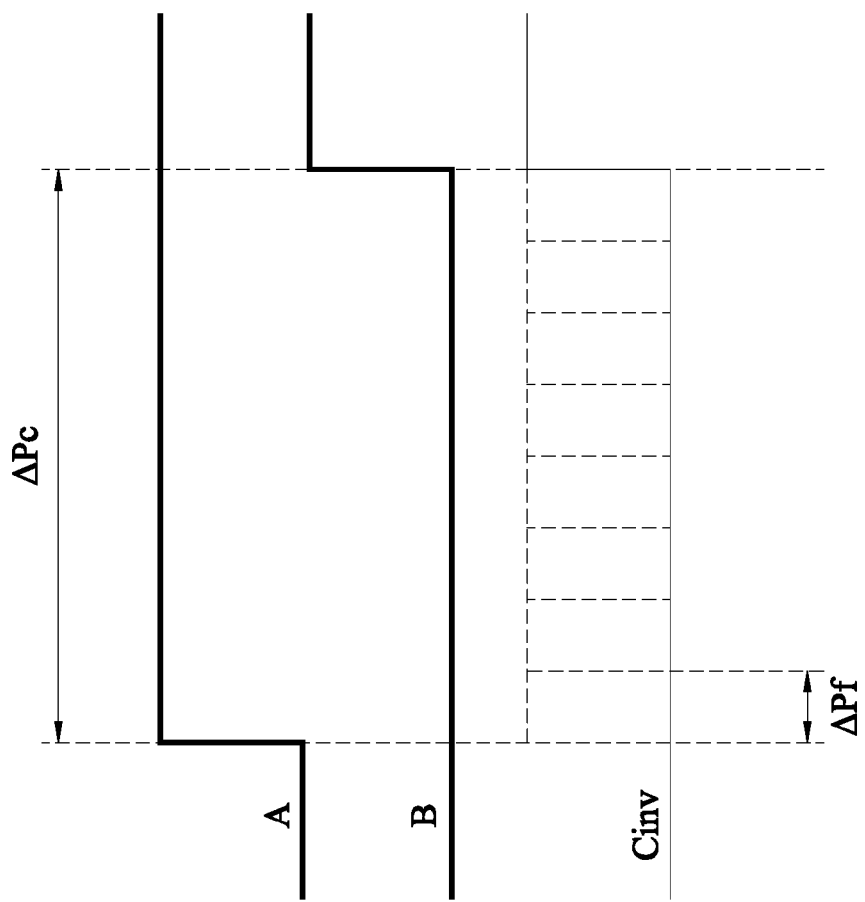
FIG. 1B is an exemplary plot of input and output signals of the phase interpolator in FIG. 1A in accordance with some embodiments.

FIG. 1B is an exemplary plot of input and output signals of the phase interpolator 105 in FIG. 1A in accordance with some embodiments. The exemplary input signal 111 to the first variable inverter 117 at node A is labeled as "A", and the exemplary input signal 114 to the second variable inverter 114 at node B is labeled as "B", and the second output signal 116 at node C is inverted for easier comparison without changing the phase/delay and labeled as "Cinv". For this example, the first variable inverter 117 and the second variable inverter 118 include eight inverters connected in parallel, thus eight fine tuning steps are available. The eight fine tuning steps are controllable with a 3-bit control signal from the delay line controller 101. The eight fine tuning steps are used for fining tuning of the time delay (phase) provided by the two inverters 119 and 120.

The phase difference ΔPc between A and B corresponds the delay of a coarse tuning from one delay unit 102. The phase difference ΔPc is divided by 8 steps and each step has a phase difference (delay) ΔPf. The fine tuning of how many fine tuning steps are selected is controllable by the first variable inverter 117 and the second variable inverter 118. For example, if the first current output I1 of the first variable inverter 117 is at a maximum level (all 8 inverters are enabled) and the second current output I2 of the second variable inverter 118 is zero (all 8 inverters are disabled), then the second output 116 has the same phase as the first phase output 112. On the other hand, if the first current output I1 of the first variable inverter 117 is zero (all 8 inverters are disabled) and the second current output I2 of the second variable inverter 118 is at a maximum level (all 8 inverters are enabled), then the second output 116 has the same phase as the second phase output 115.

As the ratio of the first current output I1 of the first variable inverter 117 and the second current output I2 of the second variable inverter 118 is changed in between the minimum level and the maximum level, the phase (delay) of the second output 116 changes in between the first phase output 112 and the second phase output 115 accordingly. For example, if I1:I2=7:1, then one step of fine tuning with a delay of ΔPf is selected. If I1:I2=6:2, then two steps of fine tuning with a delay of 2×ΔPf is selected, and so on.

In some embodiments, the specified time delay ΔPf for fine tuning is in the range of about 2 ps to about 3 ps. A time delay within the specified range of about 2 ps to about 3 ps provides a time delay that is suitable for relatively low speed and relative high speed data rates in some applications. For example, the delay line circuit 100 with a fine tuning time delay within the specified range of about 2 ps to about 3 ps is capable of providing a tunable delay for low speed or low frequency signals having a signal frequency of about 800 MHz, or lower, to high speed or high frequency signals having a signal frequency of about 3200 MHz or greater, and anywhere in between, in some embodiments. Additionally, having a step delay that falls into the 2 to 3 picosecond range helps the delay line circuit 100 reduce the variation between each fining tuning step because of the smaller step value compared to other high speed DDR systems having a higher time delay step such as 6 ps to 8 ps, in some embodiments.

The phase interpolator also includes an offset unit 110. The offset unit 110 includes a speed control unit. The speed control unit is a capacitive element such as a capacitor C1, in some embodiments. The capacitive element can be any element that has a capacitance value suitable for the speed control unit as described below. The capacitor C1 is coupled to an NMOS transistor switch N1. The NMOS transistor N1 is coupled to a PMOS transistor switch P1. The PMOS transistor P1 is coupled at a node "X" in between the two inverters 119 and 120 in the second phase unit 109, in some embodiments. The NMOS transistor switch N1 is controlled by a control signal EOC. The control signal EOC is based on whether an odd number or even number of delay units 102 is passed through by the input signal 106, in some embodiments. The PMOS transistor switch P1 is controlled by a control signal PSO. The control signal PSO is based on a process sensing output from a process sensing circuit 300 or 301 (shown in FIGS. 3A-3B). The process sensing output indicates whether a PMOS transistor or an NMOS transistor in the delay units 102 has a higher current capacity.

The control signals EOC and PSO are provided based on the instruction from the delay line controller 101 that is connected to the process sensing circuit 300 or 301, in some embodiments. The control signal PSO is provided directly by the process sensing circuit 300 or 301, in some embodiments. Based on the control signals EOC and PSO, the capacitor C1 is selectively added to the second phase unit 109. In some other embodiments, the control signals EOC or PSO is inverted and the PMOS transistor P1 or the NMOS transistor N1 is replaced by the opposite type transistor accordingly, i.e., an NMOS transistor or a PMOS transistor.

In the scenario where the delay line controller 101 has the instruction to cause the input signal 106 to be transmitted through delay units 102a and 102b, the first output signal 107 is delayed by passing through two delay units 102a and 102b. In some embodiments, the control signal EOC is "1" (logic high) in this example, as the input signal 106 passes through the inverters 103a in the delay unit 102a and the pass gate 104b in the delay unit 102b, but not the inverters 103b in the delay unit 102b. Because EOC is "1", the NMOS transistor N1 is turned on. For process corners where an NMOS transistor is faster than a PMOS transistor due to higher current capacity (including NMOS:PMOS=TypicalTypical, FastFast, SlowSlow, or FastSlow corners), the control signal PSO=0 in this example. Thus, the PMOS transistor P1 is turned on. Because the NMOS transistor N1 and the PMOS transistor P1 are turned on, the capacitor C1 is coupled to the node X between the two inverters 119 and 120.

Assuming the input signal 106 has an H phase, the input signal 106 is inverted from the H phase to L phase by the upper inverter 103a of the delay unit 102a and relayed in the same phase, i.e. L phase by the pass gate 104b of the delay unit 102b back to delay unit 102a. The lower inverter 103a of the delay unit 102a then inverts the input signal 106 from the L phase to the H phase for the first output signal 107. The first output signal 107 is inverted by the inverter 119 of the second phase unit 109 to L phase at the node X. Because the input signal 106 goes through at the pass gate 104b with the L phase (falling edge) in the delay unit 102b that is influenced by the relatively fast NMOS transistor performance, the input signal 106 has a relatively fast phase. Thus, the capacitor C1 (speed control unit) is added to the node X, and the second phase output 115 is slowed down by the capacitor C1 to compensate for the fast phase through the pass gate 104b. The second output signal 116 will have an adjusted phase as a result after the compensation by the offset unit 110 using the capacitor C1 as the speed control unit.

The capacitance value of C1 can be determined by estimating (e.g., measurement or simulation) a delay difference between a slow phase signal and a fast phase signal, in some embodiments. For example, if the input signal 106 goes through the pass gate 104b with the L phase that is faster than the H phase by 20 ps in delay time, the capacitance value C1 is chosen to increase the delay time by 20 ps, in some embodiments. In at least one example, if the L phase delay is 60 ps and the H phase delay is 80 ps, the capacitance value of C1 is selected to increase the loading at the node X by 20/60 (i.e., ⅓ or 33%), and increase the delay time by 20 ps. In some embodiments, the capacitor C1 is a variable capacitor which can be controlled to provide a different delay time based on a process corner variations or other reasons.

For the process corner where an NMOS transistor is slower than a PMOS transistor (NMOS:PMOS=SlowFast corner), the control signal PSO=1 in some embodiments. Thus, the PMOS transistor P1 is turned off. Because the PMOS transistor P1 is turned off, the capacitor C1 is not coupled to the node X between the two inverters 119 and 120. In this case, because the input signal 106 goes through at the pass gate 104b with the L phase (falling edge) in the delay unit 102b that is influenced by the NMOS transistor performance (that is slower than the PMOS transistor under the process condition of SlowFast corner), the input signal 106 has a relatively slow phase. Therefore, no additional delay from the capacitor C1 is added.

In another scenario where the delay line controller 101 has the instruction to cause the input signal 106 to be transmitted through delay units 102a, 102b and 102c, the first output signal 107 is delayed by passing through three delay units 102a, 102b, and 102c. In some embodiments, the control signal EOC is "0" (logic low) in this case, as the input signal 106 passes through the inverters 103a and 103b in the delay units 102a and 102b, and the pass gate 104c in the delay unit 102c, but not the inverters 103c in the delay unit 102c. Because EOC is "0", the NMOS transistor N1 is turned off. For process corners where an NMOS transistor is faster than a PMOS transistor due to higher current capacity (including NMOS:PMOS=TypicalTypical, FastFast, SlowSlow, or FastSlow corners), the control signal PSO=0 in some embodiments. Thus, the PMOS transistor P1 is turned on. Because the NMOS transistor N1 is turned off and the PMOS transistor P1 is turned on, the capacitor C1 is not coupled to the node X between the two inverters 119 and 120.

Assuming the input signal 106 has an H phase, the input signal 106 is inverted from H phase to L phase by the upper inverter 103a of the delay unit 102a, inverted from L phase to H phase by the upper inverter 103b of the delay unit 102b, and relayed in the same phase, i.e., H phase, by the pass gate 104c of the delay unit 102c back to delay unit 102b. The lower inverter 103b of the delay unit 102b then inverts input signal 106 from the H phase to the L phase and the lower inverter 103a of the delay unit 102a inverts the input signal 106 from the L phase to the H phase for the first output signal 107. The first output signal 107 is inverted by the inverter 119 of the second phase unit 109 to L phase at the node X.

Because the input signal 106 goes through at the pass gate 104c with the H phase (rising edge) in the delay unit 102c that is influenced by the PMOS transistor performance (that is slower than the NMOS transistor under the process conditions mentioned in the previous paragraph), the input signal 106 has a relatively slow phase. Thus, by not adding the capacitor C1 (speed control unit) to the node X when the transmitted signal has a slow phase, the second phase output 115 is not further slowed down.

For the process corner where an NMOS transistor is slower than a PMOS transistor (NMOS:PMOS=SlowFast corner), the control signal PSO=1. Thus, the PMOS transistor P1 is turned off. Because the NMOS transistor N1 and the PMOS transistor P1 are turned off, the capacitor C1 is not coupled to the node X between the two inverters 119 and 120. In this case, because the input signal 106 goes through at the pass gate 104c with the H phase (rising edge) in the delay unit 102c that is influenced by the PMOS transistor performance (that is faster than the NMOS transistor under the process condition of SlowFast corner), the input signal 106 has a relatively fast phase. However, no additional delay from the capacitor C1 is added in this example for the process corner (SlowFast). In some other embodiments, a speed control unit (e.g., C1 or another capacitor) may be coupled to the second phase unit 109 to slow down the fast phase in this case.

By using the delay line circuit 100, variations of step delay can be reduced by compensating for fast or slow phase variations. The delay line circuit 100 compensates for systematic phase variations depending on the number of delay units 102 passed through and also depending on process corners of devices within the delay line circuit 100. Therefore, the delay line circuit 100 is adaptive to delay line length and process variations.

Figure 2:
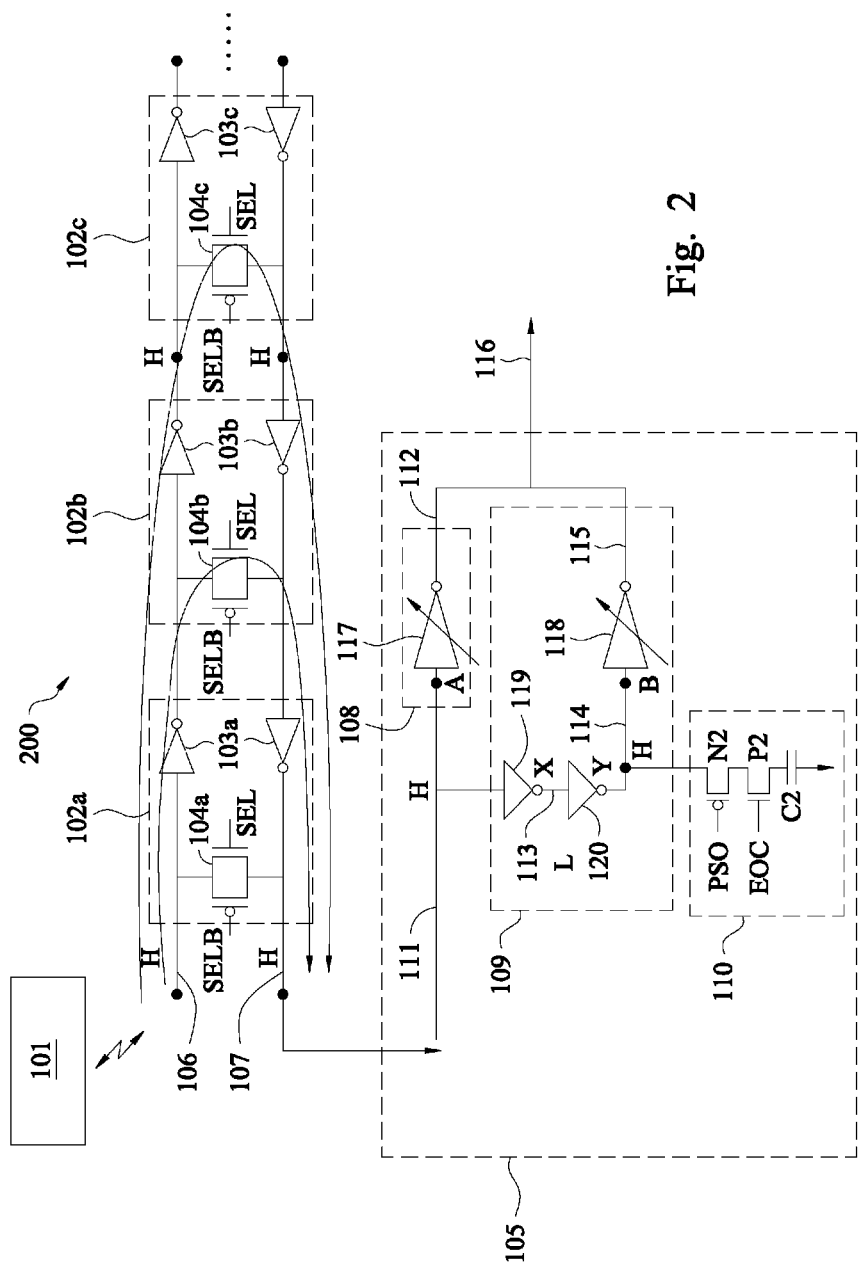
FIG. 2 is an exemplary delay line circuit in accordance with some embodiments.

FIG. 2 is an exemplary delay line circuit 200 in accordance with some embodiments. The delay line circuit 200, which comprises many of the features discussed with respect to delay line circuit 100 (FIG. 1A), provides coarse tuning and fine tuning steps with reduced step delay variations. In this example, the input signal 106 goes through the delay units 102 to provide the first output signal 107 for coarse tuning. Then the first output signal 107 is transmitted to the phase interpolator 105 for fine tuning. Also, the offset unit 110 provides phase compensation for the second output 116 based on fast phase and slow phase conditions in a similar way as described above with respect to FIG. 1A.

The offset unit 110 in FIG. 2 includes a PMOS transistor P2 controlled by control signal EOC and an NMOS transistor N2 controlled by control signal PSO. Depending on the control signals EOC and PSO, the NMOS transistor N2 or PMOS transistor P2 is turned on or off in order to selectively add a speed control unit such as a capacitor C2 to a node Y between the inverter 120 and the variable inverter 118. A capacitance value of C2 is able to be determined by estimating (e.g., measurement or simulation) the delay difference between a slow phase signal and a fast phase signal in some embodiments. For example, if the input signal 106 goes through the pass gate 104b with the L phase that is faster than the H phase by 20 ps in delay time, the capacitance value C2 is chosen to increase the delay time by 20 ps in some embodiments. In one example, if the L phase delay is 60 ps and the H phase delay is 80 ps, the capacitance value of C2 is selected to increase the loading at the node Y by 1/3 or 33%, and increase the delay time by 20 ps.

Since the signal at node X in FIG. 1A is inverted by the inverter 120 to provide the signal at node Y in FIG. 2, the function of control signals PSO and EOC in FIG. 2 is logically inverted from the function of control signals PSO and EOC in FIG. 1A. This inversion can be implemented by changing the NMOS transistor N1 coupled to EOC and the PMOS transistor P1 coupled to PSO in FIG. 1A to the opposite type transistors, i.e., PMOS transistor P2 and NMOS transistor N2 as in FIG. 2, in some embodiments.

In some embodiments, the control signals PSO and EOC are inverted instead and the same type transistors as in FIG. 1A, i.e., NMOS transistor N1 and the PMOS transistor P1, are used in FIG. 2 to be coupled to the capacitor C2 and the node Y. In some embodiments, any combination of inverting the control signal (EOC or PSO) or using the opposite type of transistor as the switch between the speed control unit (C1 or C2) and the node X or Y are used as long as the phase compensation as described above with respect to FIG. 1A is achieved.

Figure 3A:
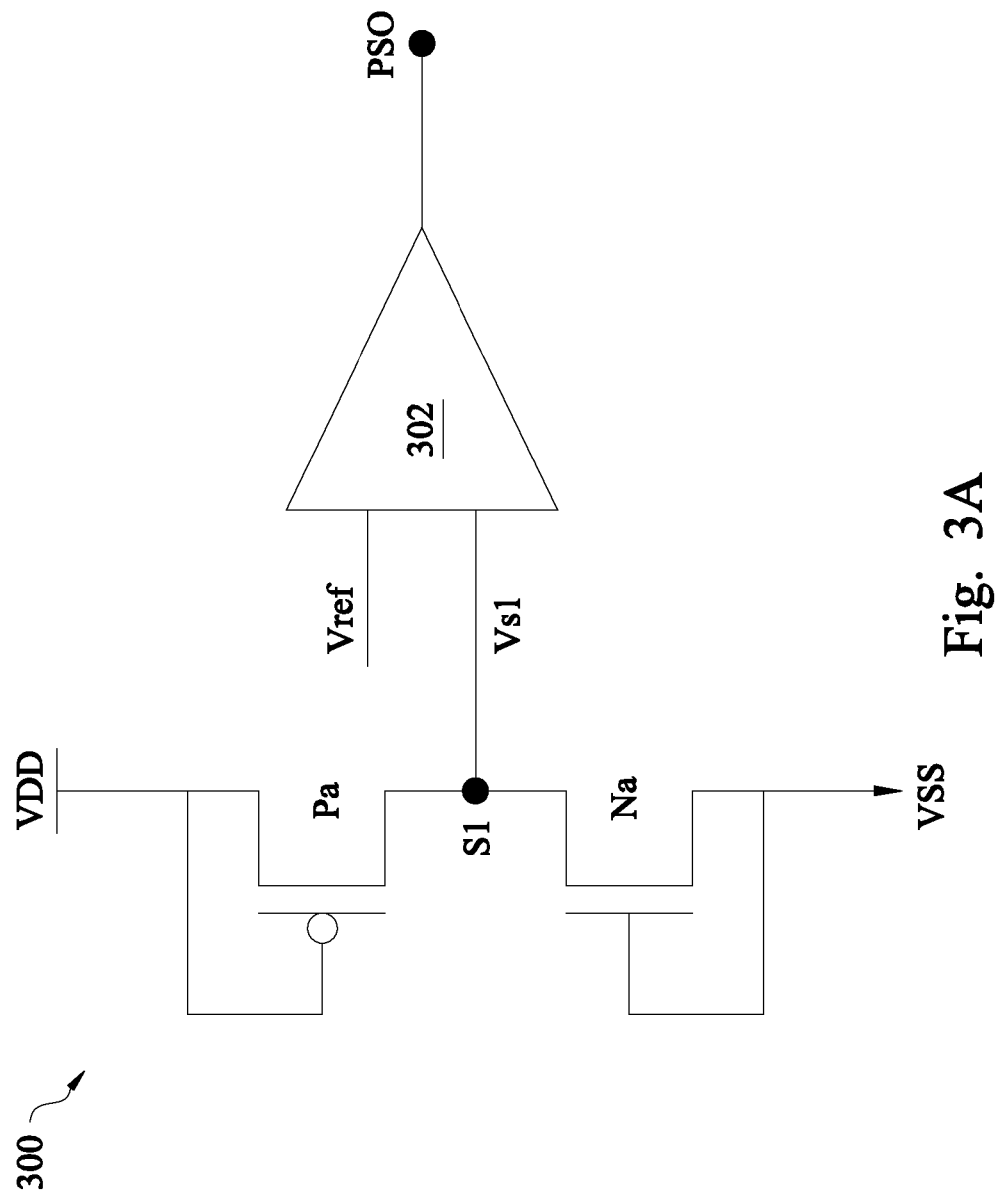
FIGS. 3A and 3B are exemplary process sensing circuits in accordance with some embodiments.
Figure 3B:
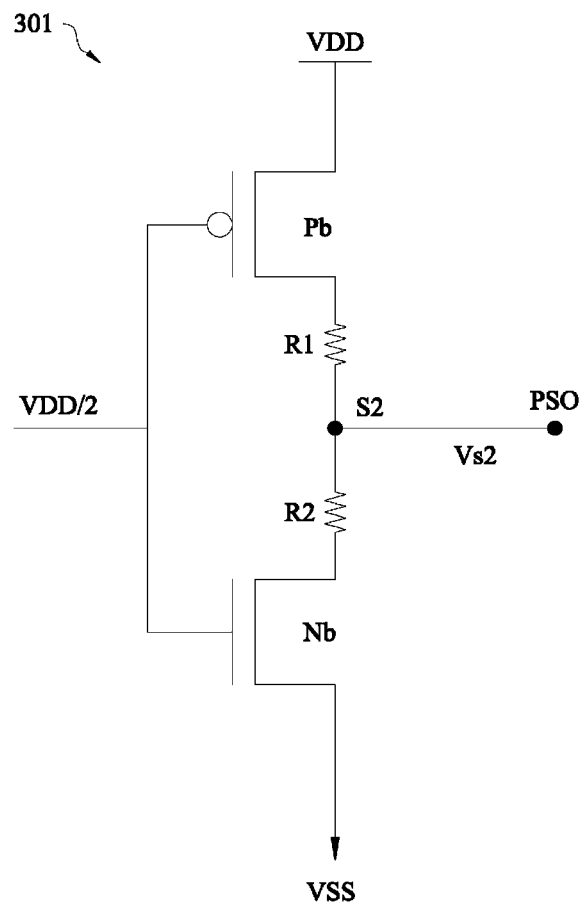

FIGS. 3A and 3B are exemplary process sensing circuits in accordance with some embodiments. In FIG. 3A, a PMOS transistor Pa and an NMOS transistor Na are connected between the high power supply voltage VDD and the low power supply voltage VSS in a process sensing circuit 300. A gate of the PMOS transistor Pa is connected to the high power supply voltage VDD, and a gate of the NMOS transistor Na is connected to the low power supply voltage VSS.

Even though the PMOS transistor Pa and the NMOS transistor Na are turned off, there is small leakage current from the high power supply voltage VDD to the low power supply voltage VSS. The voltage signal Vs1 at node S1 between the PMOS transistor Pa and the NMOS transistor Na is sent to a comparator 302. The voltage Vs1 is compared to a reference voltage Vref by the comparator 302. The comparator 302 provides an output as the process sensing output PSO to be used in the delay line circuit 100 (FIG. 1A) or 200 (FIG. 2), in some embodiments.

In some embodiments, the reference voltage Vref is set to VDD/2. If Vs1 is higher than Vref, PSO=1, which means the PMOS transistor Pa has a higher current capacity than the NMOS transistor Na. If Vs1 is lower than Vref, PSO=0, which means that the NMOS transistor Na has a higher current capacity than the PMOS transistor Pa.

In FIG. 3B, a PMOS transistor Pb and an NMOS transistor Nb are connected between the high power supply voltage VDD and the low power supply voltage VSS in a process sensing circuit 301. A gate of the PMOS transistor Pb and a gate of the NMOS transistor Nb are connected to VDD/2 in some embodiments. Resistors R1 and R2 are connected between the PMOS transistor Pb and the NMOS transistor Nb to limit a current from VDD to VSS, in some embodiments. The resistance values of R1 and R2 independently range from 10 kohm to 20 kohm, in some embodiments.

The voltage signal Vs2 at node S2 between the resistors R1 and R2 is an output of the process sensing circuit 301 including the PMOS transistor Pb and NMOS transistor Nb. With the input voltage set as VDD/2, the output voltage Vs2 is an analog voltage value higher than VDD/2 if the PMOS transistor Pb has a higher current capacity than the NMOS transistor Nb, and lower than VDD/2 if the NMOS transistor Nb has a higher current capacity than the PMOS transistor Pb in some embodiments. The output voltage Vs2 is provided as the process sensing output PSO to be used in the delay line circuit 100 (FIG. 1A) or 200 (FIG. 2), in some embodiments.

Figure 4:
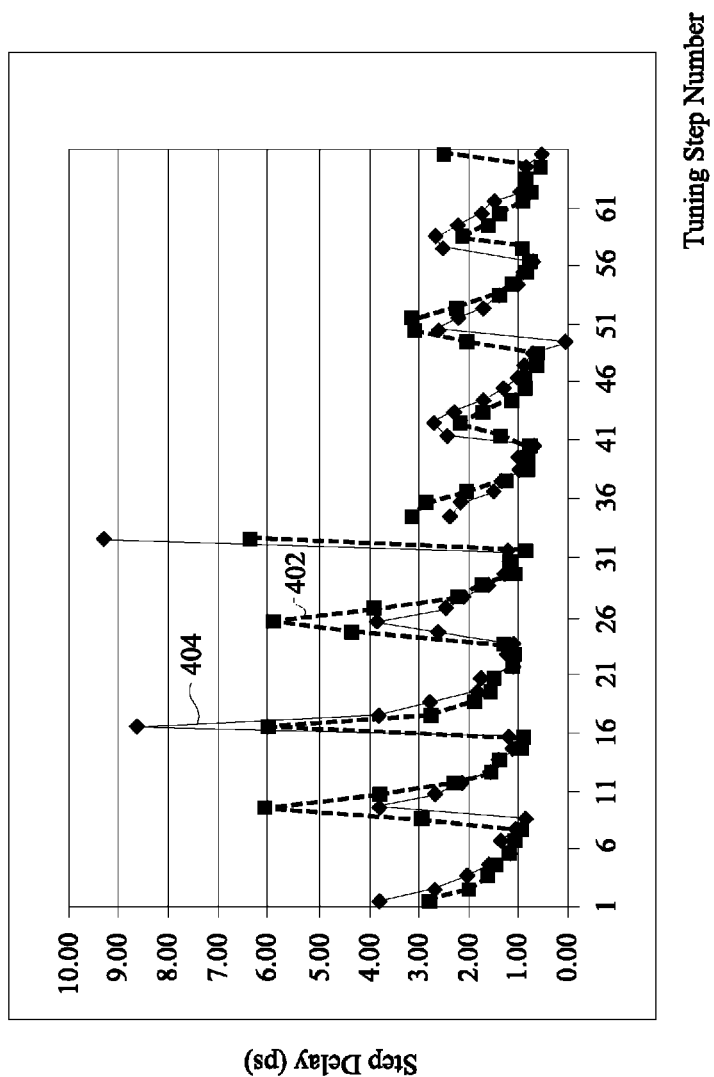
FIG. 4 is a plot of step delay of the exemplary delay line circuit in FIG. 1A in accordance with some embodiments.

FIG. 4 is a plot of step delay of the exemplary delay line circuit in FIG. 1A in accordance with some embodiments. The X-axis is the tuning step number up to 64. The tuning step number in this example is for a 6-bit <5:0> tuning control signal having 64 tuning steps. The control signal is provided by the delay line controller 101 to control the coarse tuning by the delay units 102 and the fine tuning by the phase interpolator 105.

In this example, 3 bits <5:3> of the 6-bit tuning control signal is used to specify the number of delay units 102 from eight available delay units 102 that the input signal 106 goes through for coarse tuning. The last bit <3> of the 3 bits <5:3> are used to indicate whether an even or odd number of delay units 102 are used, in some embodiments. The control signal EOC is provided based on this bit <3>, in some embodiments. The other 3 bits <2:0> are used for fine tuning with 8 steps, in some embodiments.

A plot 402 for the delay line circuit 100 indicates step delay values ranging from about 0.7 ps to about 6.4 ps. In comparison, a plot 404 for another delay line circuit indicates step delay values ranging from about 0.1 ps to about 9.6 ps. Therefore, by using the delay line circuit 100, the difference between the maximum value and the minimum value of the step delay values was reduced to provide more consistent step delay values.

Figure 5:
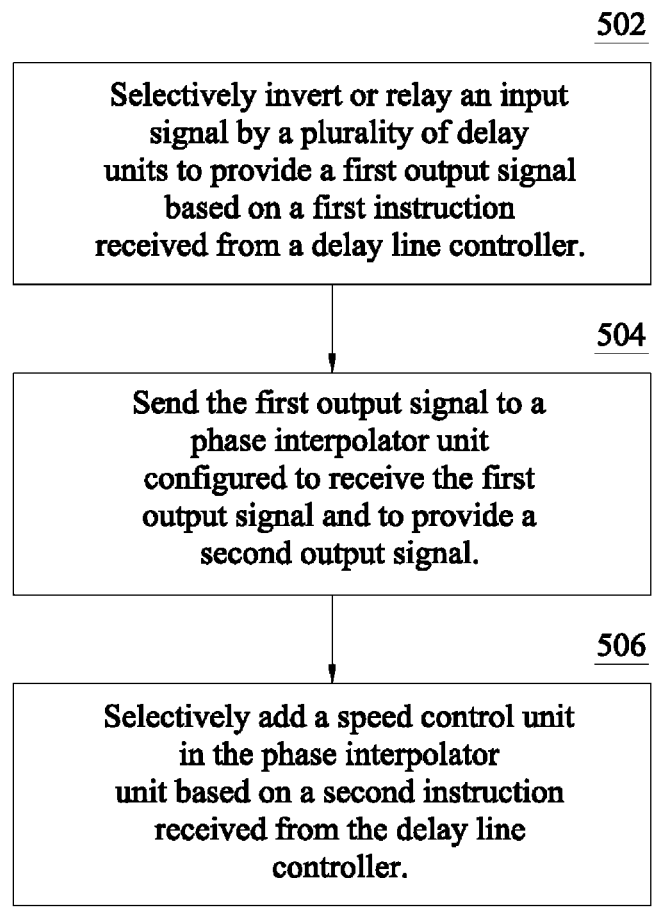
FIG. 5 is a flowchart of a method of operation for an exemplary delay line circuit in accordance with some embodiments.

FIG. 5 is a flowchart of a method of operation for an exemplary delay line circuit in accordance with some embodiments. At step 502, an input signal, e.g., input signal 106, is selectively inverted or relayed by a specified number of delay units, e.g., delay units 102, to provide a first output signal, e.g., first output signal 107, based on a first instruction received from a delay line controller, e.g., delay line controller 101. The number of delay units 102 that the input signal 106 goes through is controlled based on the first instruction for coarse tuning of signal delay in some embodiments.

At step 504, the first output signal 107 is sent to a phase interpolator unit, e.g., phase interpolator unit 105, configured to receive the first output signal 107 and to provide a second output signal, e.g., second output signal 116. The phase interpolator unit 105 provides the second output signal 116 with a selected number of fine tuning steps, each fine tuning step being delayed from a previous fine tuning step by a specified time delay. The specified time delay is in a range of about 2 ps to about 3 ps, in some embodiments. The selected number of fine tuning steps is controlled by the delay line controller 101 in some embodiments.

At step 506, a speed control unit such as a capacitor, e.g., capacitor C1, is selectively added in the phase interpolator unit 105 based on a second instruction received from the delay line controller 101. The second instruction is based on whether the specified number of the delay units is even or odd in some embodiments. In some embodiments, the second instruction is control signal EOC (FIG. 1A). The third instruction is based on a process sensing output PSO, in some embodiments. The process sensing output PSO indicates whether a PMOS transistor or an NMOS transistor in the delay units 102 has a higher current capacity, in some embodiments. The third instruction is the process sensing output PSO provided by a process sensing circuit, e.g., process sensing circuit 300 (FIG. 3A) or 301 (FIG. 3B), in some embodiments. The instruction based on PSO can be provided as a separate instruction from the instruction based on EOC in some embodiments.

By using the delay line circuit 100 or 200 disclosed herein, variations of step delay are reduced, in comparison with other delay line circuits, by compensating for fast or slow phase variations. The delay line circuit 100 or 200 compensates for systematic phase variations depending on the number of delay units 102 and also depending on process corners. Therefore, the delay line circuit is adaptive to delay line length and process variations.

An aspect of the present disclosure is directed to a delay line circuit comprising: a coarse-tuning arrangement, including delay units; and a fine-tuning arrangement including at least three serially-connected inverters. The coarse-tuning arrangement is configured to receive an input signal and coarsely-tune the input signal, the coarsely-tuning including transferring the input signal through a selected number of the delay units and thereby producing a first output signal. The fine-tuning arrangement is configured to receive the first output signal, finely-tune the first output signal, and produce a second output signal, the finely-tuning including selectively connecting a speed control unit to a node between a corresponding pair of the at least three serially-connected inverters.

Another aspect of the present disclosure is directed to a method of operating a delay line circuit, the method comprising: coarsely-tuning an input signal, the coarsely-tuning including: transferring the input signal through a selected number of delay units and thereby producing a first output signal. The method further comprising: finely-tuning the first output signal and thereby producing a second output signal, the finely-tuning including: transferring the first output signal (107) through at least first (119), second (120) and third (118) serially-connected inverters; and selectively connecting a speed control unit to a serial-connection node between two serially-connected ones of the at least first, second and third serially-connected inverters.

Another aspect of the present disclosure is directed to a delay line circuit comprising: a coarse-tuning arrangement, including delay units, each of the delay unit delay units including a pass gate, the coarse-tuning arrangement being configured to receive an input signal and coarsely-tune the input signal; the coarse-tuning arrangement being further configured to coarsely-tune by transferring the input signal through a selected number of the delay units and thereby producing a first output signal; the input signal passing through the pass gate of a given one of the selected number of the delay units; and a fine-tuning circuit configured to receive the first output signal, finely-tune the first output signal, and produce a second output signal, the fine-tuning arrangement being further configured to finely-tune the first output signal based on a phase of the input signal at an input to the given one of the selected number of the delay units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A delay line circuit comprising:
   a coarse-tuning arrangement, including delay units, the coarse-tuning arrangement being configured to receive an input signal and coarsely-tune the input signal, the coarsely-tuning including:
      transferring the input signal through a selected number of the delay units and thereby producing a first output signal; and
   a fine-tuning arrangement, including at least three serially-connected inverters, the fine-tuning circuit being configured to receive the first output signal, finely-tune the first output signal, and produce a second output signal, the finely-tuning including:
      selectively connecting a speed control unit to a first node between a corresponding pair of the at least three serially-connected inverters;
   the at least three serially-connected inverters representing a first phase unit, the first phase unit being configured to provide a first phase intermediate signal having a first phase; and
   the fine-tuning arrangement further including:
      a second phase unit configured to provide a second phase intermediate signal having a second phase; and
      a second node at which the first phase intermediate signal and the second phase intermediate signal are combined to form the second output signal, the second output signal having a third phase ranging from the first phase to the second phase.

2. The delay line circuit of claim 1, wherein:
   a signal on the first node to which the speed control unit is selectively connected has a same phase as the first output signal.

3. The delay line circuit of claim 1, wherein:
   the fine-tuning arrangement is configured to finely-tune the first output signal by selectively connecting a speed control unit based on a determination that the input signal passed through an even number or an odd number of the delay units.

4. The delay line circuit of claim 1, wherein:
   the speed control unit includes a capacitive element.

5. The delay line circuit of claim 1, further comprising:
   a process sensing circuit configured to provide a process sensing output that indicates whether a PMOS transistor or an NMOS transistor in the plurality of delay units has a higher current capacity.

6. The delay line circuit of claim 5, wherein:
   the fine-tuning arrangement is further configured to selectively add the speed control unit based on the process sensing output.

7. The delay line circuit of claim 1, wherein:
   the coarse-tuning arrangement is further configured to cause the first output signal to have a first number of coarse tuning steps, each coarse tuning step being delayed from a previous coarse tuning step by a first increment of time; and
   the fine-tuning arrangement is further configured to cause the second output signal to have a second number of fine tuning steps, each fine tuning step being delayed from a previous fine tuning step by a second time increment.

8. The delay line circuit of claim 7, wherein:
   the first increment of time is greater than the second increment of time.

9. The delay line circuit of claim 1, wherein:
   the first phase unit includes:
      a first variable inverter configured to have a first variable current output; and
   the second phase unit includes:
      a second variable inverter configured to have a second variable current output.

10. The delay line circuit of claim 9, wherein the first variable current output and the second variable current output are controlled together based on an instruction received from a delay line controller.

11. The delay line circuit of claim 9, wherein the second phase unit includes:
   a first inverter, an input of the first inverter being coupled to an input of the second phase unit; and
   a second inverter, an input of the second inverter being coupled to an output of the first inverter.

12. The delay line circuit of claim 11, wherein:
   the speed control unit is selectively coupled to an output of the second inverter.

13. A method of operating a delay line circuit, the method comprising:
   coarsely-tuning an input signal, the coarsely-tuning including:
      transferring the input signal through a selected number of delay units and thereby producing a first output signal; and
   finely-tuning the first output signal and thereby producing a second output signal, the finely-tuning including:
      transferring the first output signal through at least first, second and third serially-connected inverters, which represent a first phase unit configured to provide a first phase output having a first phase;

selectively connecting a speed control unit to a serial-connection first node between two serially-connected ones of the at least first, second and third serially-connected inverters; and transferring the first output signal through a second phase unit configured to provide a second phase output having a second phase; and combining the first phase intermediate signal and the second phase intermediate signal at a second node to form the second output signal, the second output signal the having a third phase ranging from the first phase to the second phase.

14. The method of claim 13, wherein:
a signal on the serial-connection first node has a same phase as the first output signal.

15. The method of claim 13, wherein:
the selectively connecting a speed control unit is based on a determination that the input signal passed through an even or an odd number of delay units.

16. The method of claim 13, wherein the selectively connecting a speed control unit includes selectively adding a capacitive element.

17. The method of claim 13, wherein:
each of the delay unit delay units includes a pass gate;
the input signal passes through the pass gate of a given one of the selected number of the delay units; and
the selectively connecting a speed control unit is based on a phase of the input signal at an input to the given one of the selected number of the delay units.

18. A delay line circuit comprising:
a coarse-tuning arrangement, including delay units, each of the delay units including a pass gate, the coarse-tuning arrangement being configured to receive an input signal and coarsely-tune the input;
the coarse-tuning arrangement being further configured to coarsely-tune by transferring the input signal through a selected number of the delay units and thereby producing a first output signal;
the input signal passing through the pass gate of a given one of the selected number of the delay units; and a fine-tuning circuit configured to receive the first output signal, finely-tune the first output signal, and produce a second output signal,
the fine-tuning arrangement being further configured to:
finely-tune the first output signal based on a phase of the input signal at an input to the given one of the selected number of the delay units;
the fine-tuning arrangement including:
a first phase unit configured to provide a first phase intermediate signal having a first phase; and
a second phase unit configured to provide a second phase intermediate signal having a second phase; and
a first node at which the first phase intermediate signal and the second phase intermediate signal are combined to form the second output signal, the second output signal the having a third phase ranging from the first phase to the second phase.

19. The delay line circuit of claim 18, wherein:
the given one of the selected number of the delay units represents a process-corner in the coarse-tuning arrangement.

20. The delay line circuit of claim 18, wherein:
the second phase unit includes at least three serially-connected inverters; and
a speed control unit selectively connectable to a second node between a corresponding pair of the at least three serially-connected inverters.

* * * * *